(12) United States Patent
Qian (10) Patent No.: US 10,187,974 B2
(45) Date of Patent: Jan. 22, 2019

(54) ELECTRONIC APPARATUS

(71) Applicant: Huawei Technologies Co., Ltd., Shenzhen (CN)

(72) Inventor: Chenyang Qian, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 15/560,391

(22) PCT Filed: Oct. 10, 2015

(86) PCT No.: PCT/CN2015/091652
§ 371 (c)(1),
(2) Date: Sep. 21, 2017

(87) PCT Pub. No.: WO2017/059594
PCT Pub. Date: Apr. 13, 2017

(65) Prior Publication Data
US 2018/0077793 A1  Mar. 15, 2018

(51) Int. Cl.
*H05K 1/02* (2006.01)
*H05K 1/14* (2006.01)
(Continued)

(52) U.S. Cl.
CPC ......... *H05K 1/0271* (2013.01); *G06F 1/1626* (2013.01); *G06F 1/1635* (2013.01);
(Continued)

(58) Field of Classification Search
CPC ...... H05K 1/162; H05K 1/182; H05K 1/0224; H05K 5/00; H05K 7/00; G06K 9/0053
(Continued)

(56) References Cited

U.S. PATENT DOCUMENTS

| 7,957,123 B2 * | 6/2011 | Horii | H04M 1/0249 |
| | | | 206/320 |
| 8,654,084 B2 * | 2/2014 | Hong | G06F 1/1624 |
| | | | 178/18.01 |

(Continued)

FOREIGN PATENT DOCUMENTS

| CN | 102291935 A | 12/2011 |
| CN | 102447755 A | 5/2012 |

(Continued)

*Primary Examiner* — Tuan T Dinh
(74) *Attorney, Agent, or Firm* — Leydig, Voit & Mayer, Ltd.

(57) ABSTRACT

The main body includes a first surface and a second surface opposite to the first surface. The accommodating groove is located on the first surface, and the battery compartment is located on the second surface. The circuit board is adjacent to the battery compartment. A flexible circuit board is disposed on the display screen module. A hole is disposed in a groove bottom wall of the accommodating groove. The hole penetrates one end, at which the battery compartment is disposed, of the second surface. The battery is accommodated in the battery compartment. The enclosure covers the main body to enclose the battery compartment. The display screen module is accommodated in the accommodating groove. The flexible circuit board passes through the hole, winds from a side of the battery compartment to a surface, facing the enclosure, of the battery, and extends along the surface until connected to the circuit board.

10 Claims, 5 Drawing Sheets

(51) Int. Cl.
*G06F 3/041* (2006.01)
*H01M 2/10* (2006.01)
*H01M 10/42* (2006.01)
*H01R 12/77* (2011.01)
*H01R 12/79* (2011.01)
*H04R 1/02* (2006.01)
*H05K 5/00* (2006.01)
*G06F 1/16* (2006.01)
*H04M 1/02* (2006.01)

(52) U.S. Cl.
CPC .......... *G06F 3/041* (2013.01); *H01M 2/1022* (2013.01); *H01M 10/425* (2013.01); *H01R 12/775* (2013.01); *H01R 12/79* (2013.01); *H04M 1/026* (2013.01); *H04M 1/0262* (2013.01); *H04M 1/0277* (2013.01); *H04R 1/028* (2013.01); *H05K 1/028* (2013.01); *H05K 1/14* (2013.01); *H05K 5/0017* (2013.01); *H05K 5/0086* (2013.01); *G06F 2203/04102* (2013.01); *H01M 2220/30* (2013.01)

(58) Field of Classification Search
USPC ...... 361/749, 752–753, 814, 679.55–679.58; 174/250, 254, 260–262
See application file for complete search history.

(56) References Cited

U.S. PATENT DOCUMENTS

| | | | |
|---|---|---|---|
| 2010/0025085 A1* | 2/2010 | Torigoshi | H05K 1/0224 174/254 |
| 2011/0228458 A1 | 9/2011 | Richardson et al. | |
| 2012/0200545 A1* | 8/2012 | Takahashi | H05K 1/118 345/204 |
| 2013/0217444 A1 | 8/2013 | Lee et al. | |
| 2013/0303243 A1 | 11/2013 | Park et al. | |
| 2013/0308282 A1 | 11/2013 | Shin et al. | |
| 2014/0354900 A1* | 12/2014 | Qian | G06F 1/1658 349/12 |
| 2015/0162474 A1* | 6/2015 | Uchida | H01L 31/055 136/247 |
| 2015/0245514 A1* | 8/2015 | Choung | G06K 9/00053 361/749 |

FOREIGN PATENT DOCUMENTS

| | | |
|---|---|---|
| CN | 103259888 A | 8/2013 |
| CN | 103391338 A | 11/2013 |
| CN | 103428316 A | 12/2013 |
| CN | 104935690 A | 9/2015 |
| JP | 2015005478 A | 1/2015 |

\* cited by examiner

ELECTRONIC APPARATUS

TECHNICAL FIELD

The present invention relates to the field of electronic communications, and in particular, to an electronic apparatus.

BACKGROUND

When an existing electronic apparatus, for example, an FPC (Flexible Printed Circuit) of an LCD (Liquid Crystal Display) module of a mobile phone, is installed into the mobile phone, the FPC passes under a battery installed in a front cover, so as to be connected to a circuit board inside the mobile phone. In addition, the front cover needs to accommodate the LCD module. Therefore, a hole needs to be punched right below an LCD compartment, so that the FPC is located between the battery and a battery compartment after passing through the hole. In such an assembly manner, the LCD module needs to be installed before installation of the battery. That is, the FPC is clamped between the battery and the front cover. As a result, during installation of the battery, a pressing force is generated and exerted on the FPC and the LCD compartment. Moreover, to reserve space for punching the hole for the FPC, a thickness of the front cover needs to be decreased to give way. Consequently, strength of the front cover is reduced, and the front cover is easily deformed. This affects flatness of the LCD compartment, and further affects reliability of LCD performance.

SUMMARY

Embodiments of the present invention provide an electronic apparatus, so as to resolve a technical problem that housing strength is affected because a battery exerts a pressing force on an FPC and a display module compartment body.

According to a first aspect, the present invention provides an electronic apparatus, where the electronic apparatus includes a main body, a display screen module, a battery, and an enclosure; the main body includes an accommodating groove, a battery compartment, and a circuit board; the main body includes a first surface and a second surface opposite to the first surface; the accommodating groove is located on the first surface; the battery compartment is located on the second surface; the circuit board is adjacent to the battery compartment; a flexible circuit board is disposed on the display screen module; a hole is disposed in a groove bottom wall of the accommodating groove; the hole penetrates one end, at which the battery compartment is disposed, of the second surface; the battery is accommodated in the battery compartment; the enclosure covers the main body to enclose the battery compartment; the display screen module is accommodated in the accommodating groove; and the flexible circuit board passes through the hole, winds from a side of the battery compartment to a surface, facing the enclosure, of the battery, and extends along the surface until connected to the circuit board.

In a first possible implementation, the flexible circuit board includes a connection segment, a bent segment, and an extension segment, where the bent segment connects the connection segment and the extension segment, the connection segment is connected to the display screen module, and the extension segment is connected to the circuit board.

With reference to the first possible implementation, in a second possible implementation, a mesh copper layer is disposed on a surface of the bent segment.

With reference to the first possible implementation, in a third possible implementation, buffer grooves are disposed on the connection segment, where the buffer grooves are located on two sides of a joint between the connection segment and the bent segment, and the buffer grooves extend into the connection segment.

With reference to the first possible implementation, in a fourth possible implementation, the display screen module includes a glass substrate; a part of a surface, far from the bent segment, of the connection segment is attached to a surface of the glass substrate; another part of the surface, far from the bent segment, of the connection segment extends out of the glass substrate and forms an angle with the glass substrate; and glue is disposed in the angle.

With reference to the fourth possible implementation, in a fifth possible implementation, a connecting piece is disposed at one end, far from the bent segment, of the extension segment, and the connecting piece is configured to electrically connect the circuit board.

With reference to the fifth possible implementation, in a sixth possible implementation, a ground pin is disposed on the connecting piece and is configured to implement grounding of the flexible circuit board.

With reference to any one of the first to the fifth possible implementations, in a seventh possible implementation, a first positioning line is disposed on a surface, backing on to the battery compartment, of the extension segment, and the first positioning line is configured to determine a plug-in position of the flexible circuit board in respect to the circuit board.

With reference to any one of the first to the fifth possible implementations, in an eighth possible implementation, positioning notches are disposed on two sides of the extension segment.

With reference to any one of the first to the fifth possible implementations, in a ninth possible implementation, a second positioning line is disposed on a surface of a joint between the bent segment and the extension segment, and the second positioning line is configured to determine a position of the bent segment in respect to the hole.

With reference to any one of the first aspect, or the first to the sixth possible implementations, in a tenth possible implementation, a surface, facing the battery, of the extension segment is fixed to the battery by using two-sided tape.

With reference to any one of the first aspect, or the first to the sixth possible implementations, in an eleventh possible implementation, a buffer pad is disposed on a surface, facing the battery, of the enclosure, and the buffer pad holds the flexible circuit board and the battery.

With reference to any one of the first aspect, or the first to the fifth possible implementations, in a twelfth possible implementation, two conducting layers disposed at an interval are disposed on a surface, facing the battery, of the extension segment.

With reference to any one of the first aspect, or the first to the sixth possible implementations, in a thirteenth possible implementation, the accommodating groove includes a groove bottom wall, the hole is disposed at an edge of the groove bottom wall, the electronic apparatus further includes a loudspeaker and a loudspeaker support, and the loudspeaker support is installed on the main body and is clamped between an edge of the hole and the enclosure.

With reference to any one of the first to the sixth possible implementations, in a fourteenth possible implementation, the display screen module includes an ESR reflective film, a thickness of the ESR reflective film is 0.089 mm, and a buffer layer is disposed on a surface, opposite to the connection segment, of the ESR reflective film.

To sum up, a flexible circuit board of a display screen module of the electronic apparatus in the present invention is located on an outer side between a battery and an enclosure rather than located between the battery and a battery compartment. Therefore, during assembly, neither an accommodating groove for the display screen module nor the flexible circuit board of the display screen module is pressed due to a pressing force from the battery. This avoids bending and deformation of a main body caused by the pressing force on the accommodating groove, and ensures flatness of the main body.

BRIEF DESCRIPTION OF DRAWINGS

To describe the technical solutions in the embodiments of the present invention more clearly, the following briefly describes the accompanying drawings required for describing the embodiments. Apparently, the accompanying drawings in the following description show merely some embodiments of the present invention, and a person of ordinary skill in the art may still derive other drawings from these accompanying drawings without creative efforts.

DESCRIPTION OF EMBODIMENTS

The following clearly and completely describes the technical solutions in the implementations of the present invention with reference to the accompanying drawings in the implementations of the present invention.

The present invention provides an electronic apparatus. The electronic apparatus in embodiments of the present invention includes but is not limited to a mobile phone, a tablet computer, a palmtop computer, a personal digital assistant (Personal Digital Assistant, PDA), or an electronic reader. This is not specifically limited in the embodiments of the present invention. In this embodiment, the mobile phone is used as an example.

Figure 1:
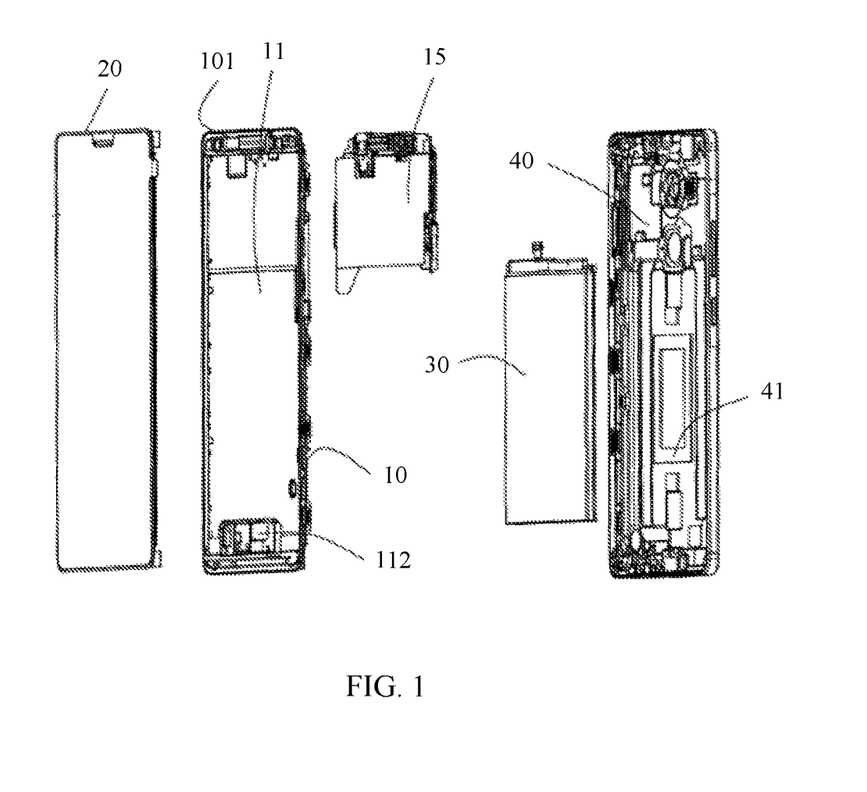
FIG. 1 is a schematic exploded view of a structure of an electronic apparatus according to the present invention.
Figure 2:
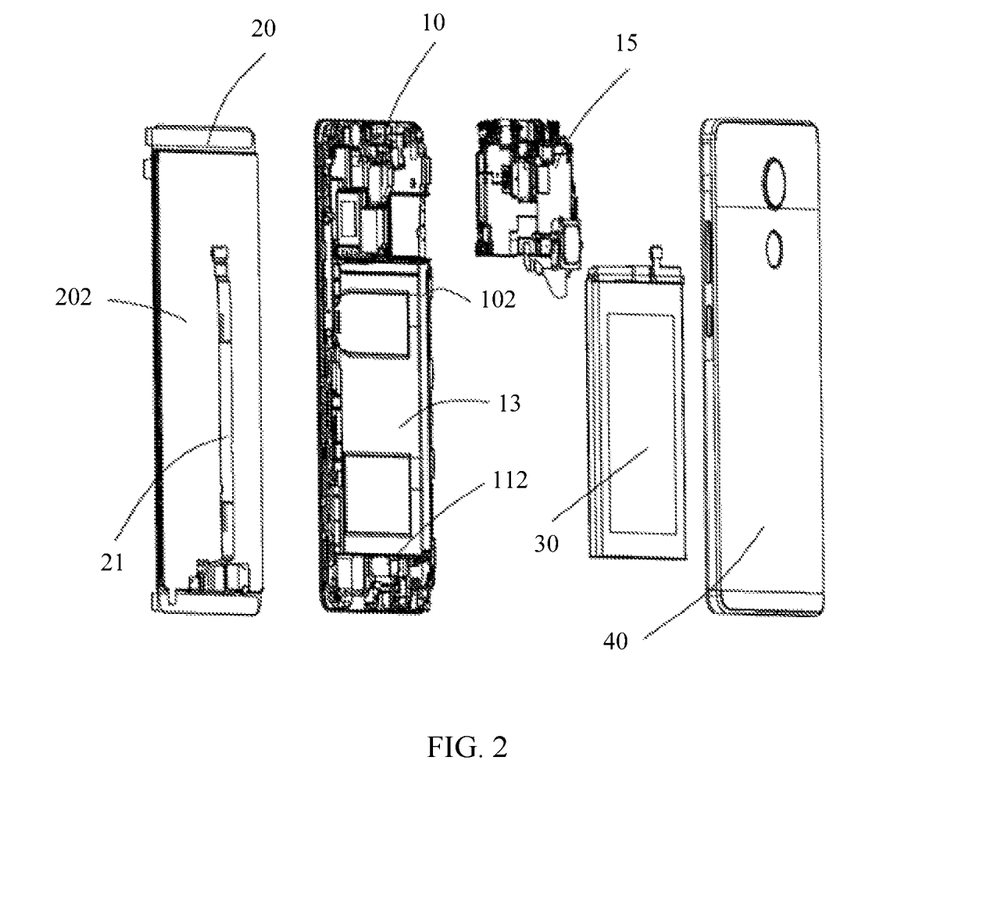
FIG. 2 is a schematic exploded view from another angle of the electronic apparatus shown in FIG. 1.

Referring to FIG. 1 and FIG. 2, the electronic apparatus includes a main body 10, a display screen module 20, a battery 30, and an enclosure 40. The main body 10 includes an accommodating groove 11, a battery compartment 13, and a circuit board 15. The main body 10 includes a first surface (not shown in the figure) and a second surface (not shown in the figure) opposite to the first surface. The accommodating groove 11 is located on the first surface. The battery compartment 13 is located on the second surface. The circuit board 15 and the battery compartment 13 are adjacently disposed. A flexible circuit board 21 is disposed on the display screen module 20. A hole 112 is disposed on a side of a groove bottom wall of the accommodating groove 11. The hole 112 penetrates one end, at which the battery compartment 13 is disposed, of the second surface. That is, the hole 112 is located at one end, at which the battery compartment 13 is far from the circuit board 15, of the second surface. The battery 30 is accommodated in the battery compartment 13. The enclosure 40 covers the main body 10 to enclose the battery compartment 13. The display screen module 20 is accommodated in the accommodating groove 11. The flexible circuit board 21 passes through the hole 112, winds from a side of the battery compartment 13 to a surface, facing the enclosure 40, of the battery 30, and extends along the surface until connected to the circuit board 15.

In this embodiment, the main body 10 is a front cover of the electronic apparatus and is set in the shape of a rectangle. The main body includes an outer surface 101 and an inner surface 102 that is disposed opposite to the outer surface 101. The accommodating groove 11 is a rectangular groove disposed on the outer surface 101, and is configured to accommodate the display screen module 20. The battery compartment 13 is disposed at one end of the inner surface 102, and is configured to accommodate the battery 30. The circuit board 15 is installed on the inner surface 102, and is disposed adjacently to the battery compartment 13. The enclosure 40 covers the inner surface 102 of the main body 10, and is configured to enclose the battery 30 and the circuit board 15 into the main body 10. In this embodiment, the enclosure 40 is a battery cover of the electronic apparatus. A concave part may be disposed on a surface, facing the battery, of the enclosure 40. The concave part is configured to cooperate with the battery compartment 13 to accommodate the entire battery 30, so as to reduce an overall thickness of the electronic apparatus. The flexible circuit board 21 specifically passes around a compartment wall of the battery compartment, extends to the top of the battery compartment 13, that is, winds to the top of an opening of the battery compartment 13, then is tightly attached to a surface of the battery, and extends along the surface until connected to the circuit board.

Figure 5:
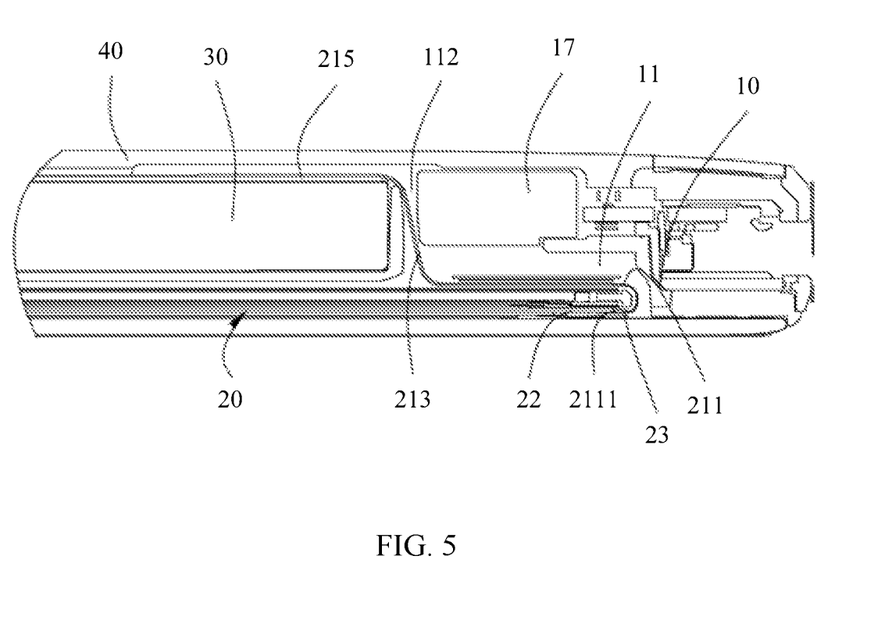
FIG. 5 is a schematic side view of an interior of the electronic apparatus shown in FIG. 1.

Referring to FIG. 1 and FIG. 5 together, further, the accommodating groove 11 includes the groove bottom wall (not shown in the figure) and a groove side wall (not shown in the figure) disposed around the groove bottom wall. The hole 112 is disposed at an edge of the side of the groove bottom wall. The electronic apparatus further includes a loudspeaker (not shown in the figure) and a loudspeaker support 17. The loudspeaker support 17 is installed on the main body 10 and is clamped between an edge of the hole 112 and the enclosure 40.

In this embodiment, the hole 112 is disposed at the edge of the groove bottom wall, that is, in a position that is on the groove bottom wall and that is adjacent to the groove side wall. Installation positions of the battery compartment 13 and the circuit board 15 are moved toward a side of the main body 10 in relation to the hole 112, so that specific space is reserved in the main body 10 to design the hole 112. In this embodiment, the hole 112 is rectangular, and a size of the hole 112 is 14 mm×6 mm. The hole 112 is disposed at the edge of the groove bottom wall of the accommodating groove 11, and the hole 112 is located on a side of the battery compartment 13 and does not penetrate into the battery compartment. Because the hole 112 is located on the side of the battery compartment and penetrates from the accommodating groove 11 rather than from the bottom of the battery compartment 13, and thickness reduction does not need to be performed at the location of the hole 112 to give way, the battery is prevented from exerting direct pressure on the hole 112, and impact on overall strength of the main body 10 is reduced. In addition, the loudspeaker support 17 holds the edge of the hole 112. This further increases strength of the groove bottom wall and avoids deformation of the groove bottom wall, thereby increasing the strength of the main body 10.

Figure 3:
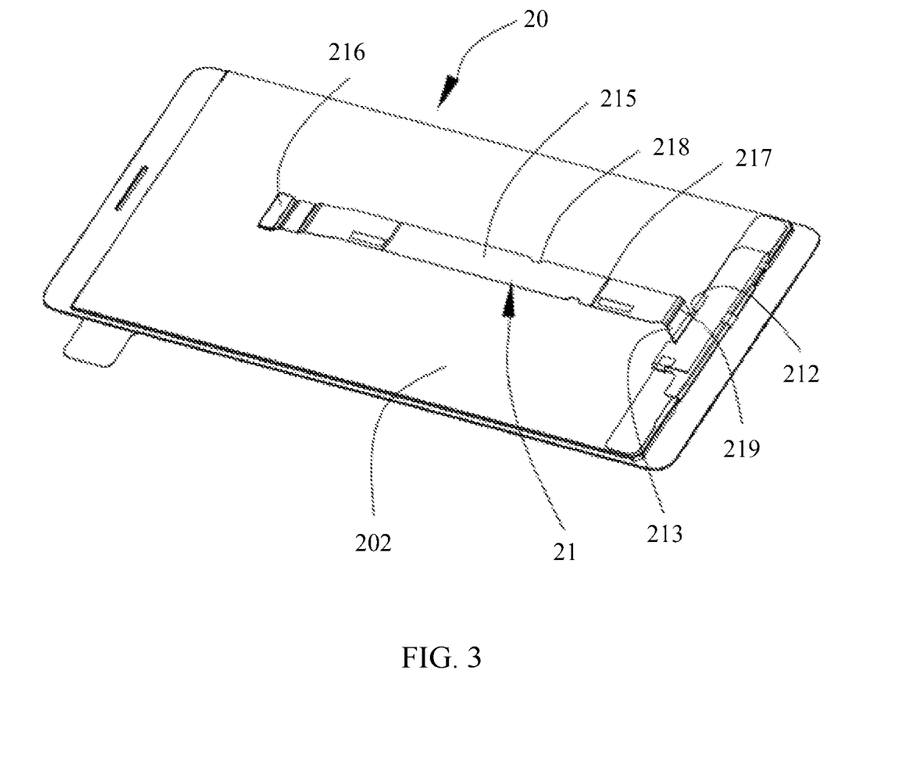
FIG. 3 is a schematic structural diagram of a display screen module shown in FIG. 1.

Referring to FIG. 3 and FIG. 5 together, further, the flexible circuit board 21 includes a connection segment 211, a bent segment 213, and an extension segment 215. The bent segment 213 connects the connection segment 211 and the extension segment 215. The bent segment 213 extends from the connection segment 211, and the extension segment 215 extends from the bent segment 213. The connection segment 211 is connected to the display screen module 20. The extension segment 215 is connected to the extension segment 215. Further, the display screen module 20 includes a glass substrate 22. A part of a surface, far from the bent segment 213, of the connection segment 211 is attached to a surface of glass substrate 22. Another part of the surface, far from the bent segment 213, of the connection segment 211 extends out of the glass substrate 22 and forms an angle with the glass substrate 22. Glue 23 is disposed in the angle.

Referring to FIG. 5, in this embodiment, the bent segment 213 extends, from one end of the connection segment 211, away from the display screen module 20. The extension segment 215 is formed by extending from one end, far from the connection segment 211, of the bent segment 213.

The display screen module 20 is a liquid crystal display. In another embodiment, the display screen module 20 may be an LED display screen. It can be understood that the glass substrate 22 is an array substrate or a color film substrate of the liquid crystal display. The display screen module 20 includes a display surface 201 and a back surface 202 (refer to FIG. 1 and FIG. 2 together). The flexible circuit board 21 is disposed on the back surface 202, and there is a gap between the flexible circuit board 21 and the back surface 202. The flexible circuit board 21 is approximately of a strip-shaped plate structure. The connection segment 211 includes a connection surface 2111. One end of the connection surface 2111 is attached to a surface of one end of the glass substrate 22. The connection surface 2111 bends around the end of the glass substrate 22 along with the connection segment 211, and is disposed in parallel with the glass substrate 22. A free end of the connection segment 211 extends, forming the bent segment 213. The bent segment 213 is approximately Z-shaped, so that the flexible circuit board passes through the hole 112 and passes around the compartment wall of the battery compartment 13, and that the extension segment 215 is located on the top of the battery compartment 13 and is attached to the battery 30. One end, far from the connection segment 211, of the bent segment 213 extends, forming the extension segment 215. A free end of the extension segment 215 may be of a flat-board structure or a bent structure.

Further, a mesh copper layer is disposed on a surface of the bent segment 213. Buffer grooves 212 (refer to FIG. 3) are disposed on two sides of a joint between the connection segment 211 and the bent segment 213, and extend into the connection segment 211. In this embodiment, on a surface of the bent segment 213, a mesh copper layer design is used instead of EMI ink coating, and softening processing is performed on the bent segment 213 to prevent the bent segment 213 from breaking when being bent. In addition, the buffer grooves 212 are disposed at the joint between the connection segment 211 and the bent segment 213. This can lessen stress between the connection segment 211 and the bent segment 213 during bending, and reduce a probability of breakage.

Further, a connecting piece 216 is disposed at one end, far from the bent segment 213, of the extension segment 215, and is configured to electrically connect the circuit board 15. In this embodiment, the connecting piece 216 is an edge connector. In another embodiment, the connecting piece 216 may be an electrical connector. Correspondingly, a conductive structure electrically connected to the connecting piece 216 is disposed on the circuit board 15.

Further, a ground pin (not shown in the figure) is disposed on the connecting piece 216, and is configured to implement grounding of the flexible circuit board 21. That is, a metal plate (the ground pin) is selected from the edge connector to perform grounding design and implement grounding of the flexible circuit board.

Further, a first positioning line 217 is disposed on a surface, backing on to the battery compartment 13, of the extension segment 215, and is configured to determine a plug-in position of the flexible circuit board 21 in respect to the circuit board 15. Positioning notches 218 are disposed on two sides of the extension segment. A second positioning line 219 is disposed on a surface of a joint between the bent segment 213 and the extension segment 215, and is configured to determine a position of the bent segment 213 in respect to the hole 112. In this embodiment, there are two first positioning lines 217 that are disposed at an interval.

Figure 4:
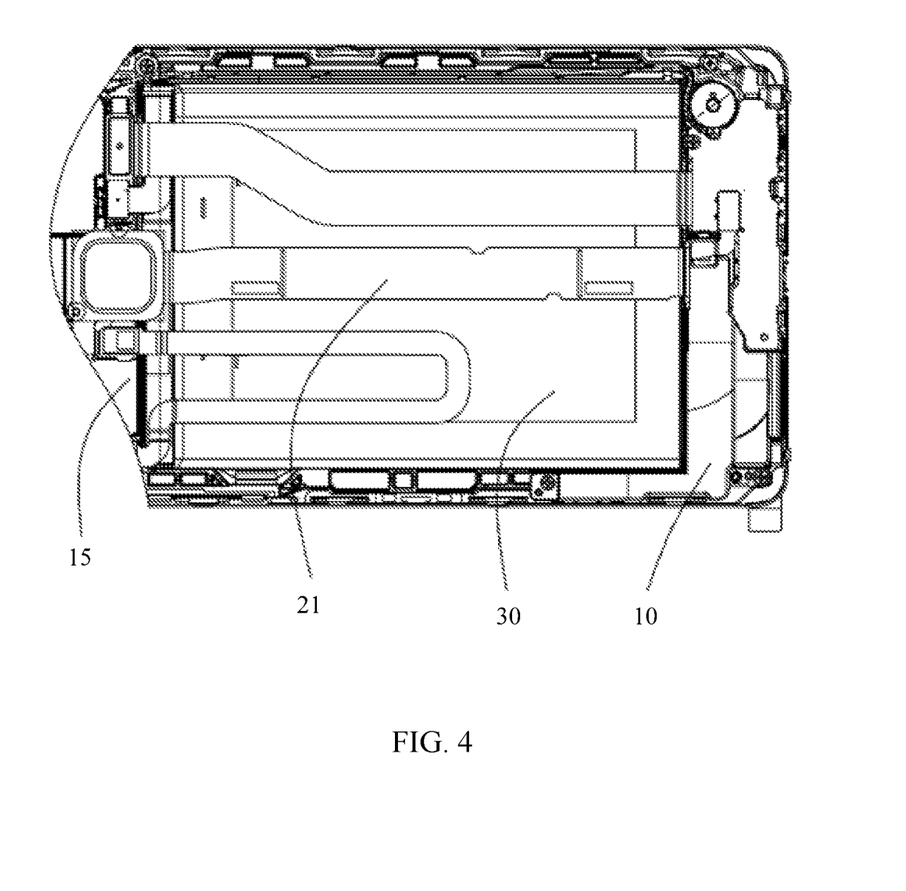
FIG. 4 is a schematic plan view of the electronic apparatus shown in FIG. 1 after the apparatus is partially assembled.

Referring to FIG. 3, FIG. 4, and FIG. 5 together, in this embodiment, during assembly of the electronic apparatus, the main body is first placed in a jig, the battery 30 is pre-installed in the battery compartment 13, and then, the display screen module 20 is installed in the accommodating groove 11 in an attached manner by using a mechanical handler. The flexible circuit board 21 passes through the hole 112, and is located on a surface, exposed from the battery compartment 13, of the battery 30. Then, the flexible circuit board is assembled in alignment with the battery 30 by using a jig (not shown in the figure). In this case, extension of the flexible circuit board 21 is positioned by using the second positioning line 219. That is, it is ensured that the bent segment 213 is located right at the hole, so as to prevent the bent segment from being pulled out of the hole when the flexible circuit board 21 is being pulled and stretched. Whether the extension segment 215 is plugged into and aligned with the circuit board is determined by using the first positioning lines 217, the positioning notches 218, and a jig, so as to prevent the extension segment 215 from deviating to two sides. In this process, because the flexible circuit board 21 is located on an outer side of the battery rather than between the battery and the battery compartment, and because the battery is installed first, the display screen module 20 and the flexible circuit board are not pressed, bending and deformation of the main body caused by a pressing force exerted on the accommodating groove that accommodates the display screen module are avoided, and flatness of the accommodating groove is ensured.

Further, a surface, facing the battery 30, of the extension segment 215 is fixed to the battery 30 by using two-sided tape, so as to prevent the flexible circuit board 21 from shifting in respect to the battery.

Further, a buffer pad 41 is disposed on a surface, facing the battery 30, of the enclosure 40. The buffer pad 41 holds the flexible circuit board 21 and the battery 30, to prevent slow motion of the battery during vibration of the electronic apparatus, ensure supply of battery power, and further position the flexible circuit board. In this embodiment, the buffer pad 41 is foam.

Further, two conducting layers (not shown in the figure) disposed at an interval are disposed on a surface, facing the battery 30, of the extension segment 215. The conducting layer may be a conductive adhesive or conductive foam, and is conductive foam in this embodiment. Pressing the conducting layers tightly with the enclosure can further fix the flexible circuit board 21, and can also implement grounding of the flexible circuit board 21.

Further, the display screen module 20 includes an ESR reflective film (not shown in the figure). A thickness of the ESR (Enhanced Specular Reflector reflector plate) reflective film is 0.089 mm, and a buffer layer (not shown in the figure) is disposed on a surface, opposite to the connection segment, of the ESR reflective film. This structure can prevent the flexible circuit board from pressing the ESR reflective film and affecting a function of the ESR reflective film.

A flexible circuit board 21 of a display screen module of the electronic apparatus in the present invention is located on an outer side between a battery and an enclosure rather than located between the battery and a battery compartment. In this way, neither an accommodating groove for the display screen module 20 nor the flexible circuit board of the display screen module is pressed due to a pressing force from the battery. This avoids bending and deformation of a main body caused by the pressing force on the accommodating groove, and ensures flatness of the main body.

The foregoing descriptions are preferred implementations of the present invention. It should be noted that a person of ordinary skill in the art may make several improvements and polishing without departing from the principle of the present invention, and the improvements and polishing shall fall within the protection scope of the present invention.

What is claimed is:

1. An electronic apparatus comprising:
   a main body comprising:
      a first surface and a second surface opposite to the first surface;
      an accommodating groove located on the first surface;
      a battery compartment located on the second surface; and
      a circuit board adjacent to the battery compartment;
      a hole disposed on a side of a groove bottom wall of the accommodating groove and wherein the hole penetrates one end, at which the battery compartment is disposed, of the second surface;
   a display screen module;
   a battery in the battery compartment; and
   an enclosure covering the main body to enclose the battery compartment;
   a flexible circuit board disposed on the display screen module;
   wherein the display screen module is supported in the accommodating groove; and the flexible circuit board passes through the hole, winds from a side of the battery compartment to a surface, facing the enclosure, of the battery, and extends along the surface and connects to the circuit board, and wherein a surface, facing the battery, of the extension segment is fixed to the battery by using double-sided tape.

2. The electronic apparatus according to claim 1, wherein the flexible circuit board comprises a connection segment; a bent segment; and an extension segment,
   wherein the bent segment connects the connection segment and the extension segment, the connection segment is connected to the display screen module, and the extension segment is connected to the circuit board.

3. The electronic apparatus according to claim 1, wherein a buffer pad is disposed on a surface, facing the battery, of the enclosure; and the buffer pad holds the flexible circuit board and the battery.

4. The electronic apparatus according to claim 1, wherein the accommodating groove comprises the groove bottom wall; the hole is disposed at an edge of the groove bottom wall; the electronic apparatus further comprises a loudspeaker and a loudspeaker support; and wherein the loudspeaker support is installed on the main body and is clamped between an edge of the hole and the enclosure.

5. The electronic apparatus according to claim 2, wherein buffer grooves are disposed on the connection segment; the buffer grooves are located on two sides of a joint between the connection segment and the bent segment; and the buffer grooves extend into the connection segment.

6. The electronic apparatus according to claim 2, wherein the display screen module comprises a glass substrate; a first part of a surface, far from the bent segment of the flexible circuit board is attached to a surface of the glass substrate; a second part of the surface, far from the bent segment of the flexible circuit board extends out of the glass substrate and forms an angle with the glass substrate; and glue is disposed in the angle.

7. The electronic apparatus according to claim 2, wherein a first positioning line is disposed on a surface of the flexible circuit board where the extension segment faces back to the battery compartment; and the first positioning line is configured to determine a plug-in position of the flexible circuit board in respect to the circuit board.

8. The electronic apparatus according to claim 2, wherein positioning notches are disposed on two sides of the extension segment.

9. The electronic apparatus according to claim 2, wherein a second positioning line is disposed on a surface of the flexible circuit board where the bent segment and the extension segment are joined; and the second positioning line is configured to determine a position of the bent segment in respect to the hole.

10. The electronic apparatus according to claim 6, wherein a connecting piece is disposed at one end, far from the bent segment, of the extension segment; and the connecting piece is configured to electrically connect the circuit board.

* * * * *